(12) United States Patent
Tatsumi et al.

(10) Patent No.: US 6,794,683 B2
(45) Date of Patent: Sep. 21, 2004

(54) DIAMOND SUBSTRATE HAVING PIEZOELECTRIC THIN FILM, AND METHOD FOR MANUFACTURING IT

(75) Inventors: Natsuo Tatsumi, Itami (JP); Takahiro Imai, Itami (JP)

(73) Assignee: Sumitomo Electric Industries, Ltd., Osaka (JP)

(*) Notice: Subject to any disclaimer, the term of this patent is extended or adjusted under 35 U.S.C. 154(b) by 51 days.

(21) Appl. No.: 10/362,890

(22) PCT Filed: Nov. 19, 2001

(86) PCT No.: PCT/JP01/10106
§ 371 (c)(1),
(2), (4) Date: Feb. 23, 2003

(87) PCT Pub. No.: WO02/42527
PCT Pub. Date: May 30, 2002

(65) Prior Publication Data
US 2003/0180984 A1 Sep. 25, 2003

(30) Foreign Application Priority Data

| Nov. 22, 2000 | (JP) | 2000-355720 |
| Mar. 27, 2001 | (JP) | 2001-089535 |
| Apr. 12, 2001 | (JP) | 2001-114056 |
| May 14, 2001 | (JP) | 2001-143104 |
| Oct. 5, 2001 | (JP) | 2001-309289 |

(51) Int. Cl.$^7$ ................................................ H01L 29/04
(52) U.S. Cl. ................................. 257/72; 310/313 A
(58) Field of Search ........................... 257/72, 77, 416, 257/623; 310/313 A, 360, 310, 187, 324; 438/105

(56) References Cited

U.S. PATENT DOCUMENTS

| 4,952,832 | A | * | 8/1990 | Imai et al. ............... 310/313 A |
| 5,565,724 | A | * | 10/1996 | Hachigo et al. ........ 310/313 A |
| 5,565,725 | A | * | 10/1996 | Nakahata et al. ....... 310/313 A |
| 5,646,468 | A | * | 7/1997 | Nakahata et al. ....... 310/313 A |
| 6,127,768 | A | * | 10/2000 | Stoner et al. .......... 310/313 A |
| 2002/0149019 | A1 | * | 10/2002 | Iwashita et al. ............... 257/72 |

FOREIGN PATENT DOCUMENTS

| JP | H05-78200 A | 3/1993 |
| JP | H05-319993 A | 12/1993 |
| JP | H07-34223 A | 2/1995 |
| JP | H07-321596 A | 12/1995 |
| JP | H08-154033 A | 6/1996 |

* cited by examiner

Primary Examiner—Matthew Smith
Assistant Examiner—V Yevsikov
(74) Attorney, Agent, or Firm—James Judge

(57) ABSTRACT

Further improvements in circuit-element performance of surface-acoustic wave devices are anticipated by being able to produce a diamond substrate on which is formed a $Li(Nb_xTa_{1-x})O_3$ (wherein $0 \leq x \leq 1$) thin film whose c-axis orientation is favorable and whose piezoelectric characteristics are satisfactory. A diamond substrate on which a highly c-axis oriented, piezoelectrically satisfactory $Li(Nb_xTa_{1-x})O_3$ (wherein $0 \leq x \leq 1$) thin film is formed can be obtained by using a laser ablation technique to form a $Li(Nb_xTa_{1-x})O_3$ (wherein $0 \leq x \leq 1$) thin film onto a (110)-oriented gas-phase synthesized polycrystalline diamond substrate, that is superficially mirror-surface processed. By utilizing a diamond substrate on which a piezoelectric-substance thin film is formed, surface-acoustic wave devices having high propagation speeds can be offered.

17 Claims, 8 Drawing Sheets

DIAMOND SUBSTRATE HAVING PIEZOELECTRIC THIN FILM, AND METHOD FOR MANUFACTURING IT

TECHNICAL FIELD

The present invention relates to diamond substrates having piezoelectric thin films, and to methods of their manufacture, utilized for surface-acoustic wave devices and optical-device materials employable in high-frequency bands.

BACKGROUND ART

Surface-acoustic wave devices exploiting surface-acoustic waves, (abbreviated SAWs hereinafter), which propagate over solid-body surfaces, are miniature, light-weight and highly temperature-stable, and have various features such as being superior in phase characteristics. Accompanying multi-channel/high-frequency transformations in mobile communications and satellite communications fields in recent years have been calls for the development of surface-acoustic wave devices employable in high-frequency bands; methods that employ materials whose surface-acoustic-wave propagation speed is fast, or methods that narrow electrode pitch have been considered. Among these, electrode pitch, being dependent on semiconductor device manufacturing technology, has limitations Meanwhile, as a material whose surface-acoustic-wave propagation speed is fast, diamond is the fastest. In this respect, a laminated structure as is in Japanese Pub. Pat. App. No. H07-321596, in which a $LiNbO_3$ layer is arranged on top of diamond, has been proposed. According to this literature, c-axis oriented $LiNbO_3$ is formed onto a diamond (111) surface by an RF-magnetron sputtering technique; but with the a value expressing the c-axis orientation being below 5°, (under 4°, furthermore), the c-axis orientation cannot be said to be all that satisfactory. Likewise, Japanese Pub. Pat. App. No. H05-78200 discloses a method of synthesizing a $Li(Nb_xTa_{1-x})O_3$ ($0 \leq x \leq 1$) thin film onto a sapphire substrate. Although the obtaining of a single-phase $Li(Nb_xTa_{1-x})O_3$ ($0 \leq x \leq 1$) thin film is disclosed in this literature, nothing is disclosed as to the quality of the thin film produced. Furthermore, in Japanese Pub. Pat. App. No. H05-319993 a surface-acoustic wave device in which a $LiNbO_3$ layer is formed onto sapphire is proposed. Nonetheless, although the $LiNbO_3$ layer's orientation is satisfactory, with propagation speed being some 4500 m/s because the acoustic velocity of sapphire compared with diamond is slower by some 30%, performance is unsatisfactory compared with devices employing diamond. Given this situation, being able to form a piezoelectrically satisfactory $Li(Nb_xTa_{1-x})O_3$ (wherein $0 \leq x<1$) thin film onto diamond should lead to improved device performance.

In that regard, $LiNbO_3$ single crystals or $LiTaO_3$ single crystals are grown industrially by the Czochralski method (CZ method). This method is carried out by selecting a congruent-melting (congruent) composition such that as the crystal proceeds to harden from the melt, the composition does not change. In $LiNbO_3$ as a congruent composition, the atomic proportion of Li to Nb in the composition—the ratio of their atomic percentages—is 0.942, which is off-balanced toward Nb from the Li/Nb=1.0 that is its stoichiometric composition. The percentages of Li and Nb affect the characteristics of $LiNbO_3$ monocrystals. In a situation in which, for example, they are off-balanced toward Nb as in the congruent composition just noted, if strong light such as a laser beam is shone on $LiNbO_3$, a so-called optical damage phenomenon in which the refractive index alters will be apparent A need therefore arises to sacrifice the optical characteristics of the $LiNbO_3$ itself and enhance the optical-damage resistance by the addition of MgO or the like.

With $Li(Nb_xTa_{1-x})O_3$ ($0 \leq x \leq 1$) thin films as well, the percentages of Li and $Nb_xTa_{1-x}$ are crucial, and in order to bring out favorable piezoelectric, electrochemical, and nonlinear-optical characteristics, the atomic constituent proportion of Li to $Nb_xTa_{1-x}$ (also referred to simply as "Li/$Nb_xTa_{1-x}$ ratio" hereinafter) must be controlled to be a value of over 0.80 and under 1.10. Wherein $LiNb_xTa_{1-x}O_3$ thin films are fabricated by laser ablation as aforementioned, a tendency for Li to decrease from the Li and $Nb_xTa_{1-x}$ percentages of the raw-material targets is apparent.

Therefore, in order to suppress eduction of $LiNbO_8$, etc. and obtain single-phase $LiNbO_3$ when forming $LiNbO_3$ thin films by laser ablation, making the Li constituent of the raw-material targets excessive is known. Japanese Pub. Pat. App. No. H05-78200, for instance, devises making the target Li to Nb proportion over 1.5 and under 3.5 when forming a $LiNbO_3$ thin film onto a sapphire substrate. It has been found, however, that if by this method $LiNbO_3$ is formed onto a diamond substrate, the Li/Nb proportion in the thin film at substrate temperatures of under 1000° C. turns out to be over 1.10. In then measuring by X-ray diffraction, $Li_3NbO_4$ has appeared; and even with the single-phase LiNbO3, the optical characteristics under optical-damage phenomena have differed from those in which Li/Nb is from 0.80 to 1.10.

Likewise, with $Li(Nb_xTa_{1-x})O_3$, wherein it has plural polarization regions, because domains whose piezoelectric constants differ cancel each other out and the overall piezoelectric characteristics do not hold, carrying out a polarization process, either when forming a $Li(Nb_xTa_{1-x})O_3$ thin film over diamond or after it is formed, is necessary. Nonetheless, post-crystallization polarizing of $Li(Nb_xTa_{1-x})O_3$ is known to be problematic. In general, the polarization of a ferroelectric substance can be aligned if after heating it beyond the Curie temperature, an electric field greater than the coercive electric field is applied to the crystal. In the case of $LiNbO_3$, however, in addition to its coercive electric field being 21 kV/mm, the 1210° C. that is the Curie temperature is close to the 1250° C. that is the melting point of $LiNbO_3$. Therefore, heating $LiNbO_3$ so that it does not melt to above the Curie temperature and applying to the crystal an electric field greater than the coercive electric field is difficult.

Likewise, because at room temperature the polarization-reversing electric field strength is close to the avalanche-current-generating electric field strength, there is a danger that avalanche current will be generated during polarization, destroying the crystal. A method of carrying out polarization in bulk $LiNbO_3$ crystals without insulator breakdown occurring despite avalanche current being generated to a certain extent, by applying a pulsed electric field to electrodes that have been furnished on either end face of the crystal, has been devised. Nevertheless, in a composite substrate of an $LiNbO_3$ thin film and polycrystalline diamond, which is an insulating substance, when avalanche current is generated, electrical load concentrates at the interface of the $LiNbO_3$ thin film and the diamond, and polarization cannot be carried out efficiently and moreover insulator breakdown ends up occurring. Given these circumstances, in composite substrates in which a $LiNbO_3$ thin film is formed onto a diamond substrate, carrying out polarization simultaneously during deposition to build the $LiNbO_3$ thin film is desirable.

Furthermore, although throughout the past betterments have been rendered in the c-axis orientation of formative Li(Nb$_x$Ta$_{1-x}$)O$_3$ thin films, even with better c-axis orientation, the piezoelectric characteristics of the formed thin film are not always satisfactory. Li(Nb$_x$Ta$_{1-x}$)O$_3$ thin films have polarization along the c-axis direction. In some c-axis oriented thin films, the +/− of the polar directions is mixed depending on the domain. In such cases, piezoelectric characteristics are manifested locally; but if the thin film is examined as a whole, the piezoelectric characteristics turn out to be nil, and the characteristics if it is made into a circuit element turn out to be unobtainable.

DISCLOSURE OF INVENTION

The present invention was devised in order to overcome the foregoing problematic points. In particular, it presents a diamond substrate on which a c-axis oriented, moreover piezoelectrically favorable Li(Nb$_x$Ta$_{1-x}$)O$_3$ (wherein 0≦x≦1) thin film is formed, and a manufacturing method therefor.

The present invention is the finding that a c-axis oriented, piezoelectrically favorable Li(Nb$_x$Ta$_{1-x}$)O$_3$ thin film built onto a diamond substrate can be obtained by forming a thin film of Li(Nb$_x$Ta$_{1-x}$)O$_3$ (wherein 0≦x≦1)—being a thin film that is a piezoelectric—onto a (110)-oriented polycrystalline diamond substrate, by means of a laser ablation technique that optically gathers pulsed laser light onto a raw material target to vaporize it instantaneously. The polycrystalline diamond on which the Li(Nb$_x$Ta$_{1-x}$)O$_3$ thin film is formed must be (110)-oriented, and must be superficially mirror-surface processed.

The "(110)-oriented polycrystalline diamond" just noted is the X-ray diffraction intensity I$_{(220)}$ of a (220) face of the polycrystal diamond being 15% or more of the sum I$_{(220)}$+I$_{(111)}$+I$_{(311)}$+I$_{(331)}$+I$_{(400)}$ of I$_{(220)}$ and the X-ray diffraction intensities I$_{(111)}$, I$_{(311)}$, I$_{(331)}$ and I$_{(400)}$ of the diamond's other faces, which are (111), (311), (331), (400). In other words, letting the proportion of I$_{(220)}$ to the total of all the peak intensities be γ$_{(110)}$, then γ$_{(110)}$=I$_{(220)}$/[I$_{(220)}$+I$_{(111)}$+I$_{(311)}$+I$_{(331)}$+I$_{(400)}$], and γ$_{(110)}$ is 15% or more—more preferably, 40% or more. (If there is no orientation, then γ$_{(110)}$ is less than 15%.)

Further, it is preferable that an epi-surface of the polycrystalline diamond be covered with an amorphous layer of 1 nm or more, 50 nm or less. A Li(Nb$_x$Ta$_{1-x}$)O$_3$ thin film formed by laser ablation onto a polycrystalline diamond of this sort is satisfactorily c-axis oriented and has favorable piezoelectric characteristics.

Herein, c-axis orientation is defined as follows. Letting the diffraction intensities for the crystal faces of Li(Nb$_x$Ta$_{1-x}$)O$_3$ apparent in X-ray diffraction on a Li(Nb$_x$Ta$_{1-x}$)O$_3$ thin film be I$_{(012)}$, I$_{(104)}$, I$_{(110)}$, I$_{(006)}$ and I$_{(400)}$, the c-axis orientation γ$_c$ is expressed as γ$_c$=I$_{(006)}$/[I$_{(012)}$+I$_{(104)}$+I$_{(110)}$+I$_{(006)}$]. The γ$_c$ is desirably 50% or more, and the value thereof large enough, in order that superior piezoelectric characteristics be manifested in the Li(Nb$_x$Ta$_{1-x}$)O$_3$ thin film.

The laser used in the laser ablation process is not particularly limited, but utilizing a laser 360 nm or less in wavelength and 1 μsec or less in pulse duration is preferable. While ArF and F$_2$ excimer lasers would be lasers of this sort, a 248 nm-wavelength KrF excimer laser in particular is preferable. The preferable laser-pulse energy density is 1 J/cm$^2$, the preferable laser frequency some 1 to 50 Hz. Further, the polycrystalline diamond substrate temperature during laser ablation should be 400° C. or more, but because polycrystalline diamond degenerates at over 1000° C., below 1000° C. is preferable. Likewise, an oxidizing atmosphere consisting of oxygen, ozone, N$_2$O, NO$_2$, etc. is desirable for the ambient, while a 0.1 to 100 Pa range is preferable for the atmospheric pressure. In addition, a 10 to 1000-mm range is suitable for the distance between the piezoelectric thin-film raw-material target and the polycrystalline diamond substrate.

Also, in order to have the atomic constituent proportion of Li to Nb$_x$Ta$_{1-x}$ in the formed Li(Nb$_x$Ta$_{1-x}$)O$_3$ thin film be in a range of from 0.80 to 1.10, it was found that the temperature of the polycrystalline diamond substrate, and the atomic constituent proportion Li/Nb$_x$Ta$_{1-x}$ of the Li and Nb$_x$Ta$_{1-x}$ in the piezoelectric thin-film raw-material target, must necessarily be within the range, plotted in FIG. 6 with these as orthogonal coordinate axes, encompassed by points A (0.9 constituent proportion, 400° C. substrate temperature; the same indications hereinafter), B(0.9, 1000° C.), C(2.5, 1000° C.), D (2.5, 700° C.), and E (1.5, 400° C.).

Moreover, in order to obtain a Li(Nb$_x$Ta$_{1-x}$)O$_3$ thin film of satisfactory crystallinity and orientation, the temperature of the diamond substrate and the atomic constituent proportion Li/Nb$_x$Ta$_{1-x}$ in the target are controlled to be within the range in FIG. 6 encompassed by points F(1.0 constituent proportion, 400° C. substrate temperature), G (1.0, 1000° C.), H (1.5, 1000° C.), and I (1.4, 400° C.).

A "Li(Nb$_x$Ta$_{1-x}$)O$_3$ thin film of satisfactory crystallinity and orientation" means a film containing no phases, such as amorphous, that are not crystallized, and wherein the (001) surface of the Li(Nb$_x$Ta$_{1-x}$)O$_3$ thin film is parallel to the substrate (so-called c-axis orientation). In the X-ray diffraction pattern for a c-axis oriented Li(Nb$_x$Ta$_{1-x}$)O$_3$ thin film, 2θ for its (006) peaks is 39°. The c-axis orientation being high means that the value of the aforementioned γ$_c$ is 50% or more.

The present invention is further characterized in that in the laser ablation technique, a one electrode is installed in the environs of the polycrystalline diamond substrate, and with the diamond substrate as the other electrode, the film is formed while a bias voltage is applied across the one electrode and the substrate. Doing so allows a Li(Nb$_x$Ta$_{1-x}$)O$_3$ (wherein 0≦x≦1) thin film to be deposited while it is polarized, and enables a Li(Nb$_x$Ta$_{1-x}$)O$_3$ (wherein 0≦x≦1) thin film whose piezoelectric characteristics are favorable to be formed onto a diamond substrate.

It is desirable that the one electrode as noted above be disposed in parallel with the film-deposition surface of the diamond substrate. Thus disposing it puts the c-axis of the Li(Nb$_x$Ta$_{1-x}$)O$_3$ thin film in parallel with the orientation of the electric field, which facilitates uniform polarization within the diamond substrate surface. In order to enlarge the electric field, the distance between the one electrode and the diamond substrate is desirably 20 mm or less.

In laser ablation, moreover, routinely the deposited film surface on the substrate is disposed normal to the flight direction of the ejected particles. In the present invention, however, the diamond substrate may be situated roughly parallel to the flight path. The foregoing one electrode in this case also is disposed so as be roughly parallel with the diamond substrate. By situating in this way the diamond substrate and the one electrode in parallel with the particles' flight direction, the particles will not pass through the electrode, thereby making it possible to suppress the in-mixing of impurities that originates in the electrode. Because the particles' flight path is roughly in a perpendicular orientation to the target surface, the diamond substrate and the one electrode are desirably disposed within an angular range of ±10° with respect to the perpendicular direction through the target surface. Beyond this range, the diamond substrate becomes shadowed as it were, and the film-formation speed drops drastically, or the effectiveness with which the particles are not let pass through the one electrode is lessened.

The foregoing one electrode is desirably a metal filament material strung into a mesh or else a grate. Inasmuch as particles ejected by the laser ablation can pass through the electrode if it is thus configured, the electrode can be disposed in an arbitrary location situating the electrode in between the target within the film-deposition device and the diamond substrate. The foregoing electrode may also be a metal sheet in a situation in which it and the diamond substrate are disposed roughly in parallel with the particles' flight direction.

Laser ablation has the following advantages compared to sputtering and other film-deposition techniques. Forming a Li(Nb$_x$Ta$_{1-x}$)O$_3$ (wherein $0 \leq x \leq 1$) thin film by exposing to oxygen plasma the diamond of the substrate is possible without damaging its surface; in-mixing of impurities is scant; because power concentration is high, Li(Nb$_x$Ta$_{1-x}$)O$_3$ activated by excitation may be employed in film formation; and film-deposition speed may be freely adjusted. These advantages of laser ablation, the diamond's orientation and surface condition in the diamond substrate, as well as the effects of the electric field should enable film-deposition of a Li(Nb$_x$Ta$_{1-x}$)O$_3$ (wherein $0 \leq x \leq 1$) thin film whose c-axis orientation and piezoelectric characteristics are favorable.

BEST MODE FOR CARRYING OUT THE INVENTION

Figure 1:
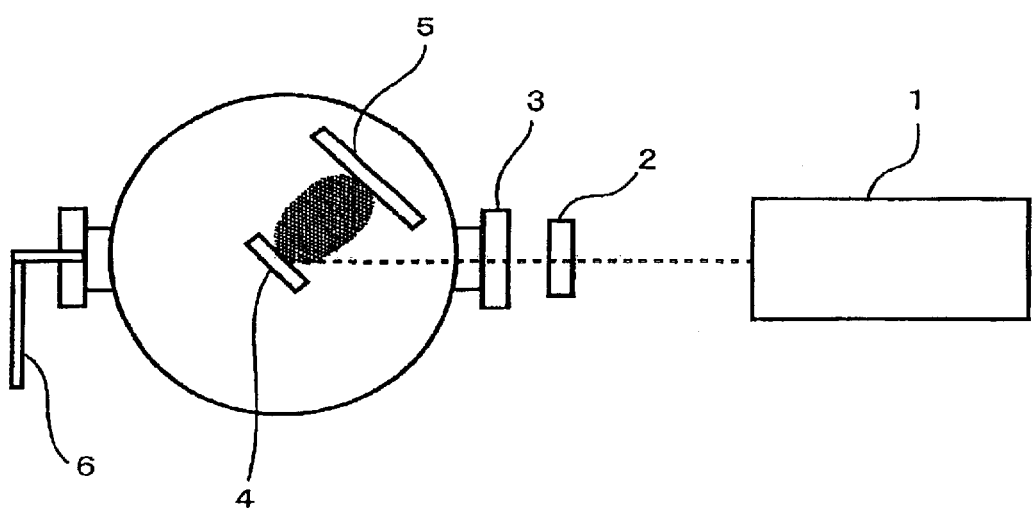
FIG. 1 illustrates an outline of one embodiment of a laser ablation device of the present invention.

The inventors found that among Li(Nb$_x$Ta$_{1-x}$)O$_3$ ($0 \leq x \leq 1$) thin films that are piezoelectric thin films, to form onto a polycrystalline diamond substrate especially a piezoelectric thin film superior in piezoelectric characteristics, laser ablation may be utilized to impart (110) orientation to the diamond in the substrate, and the diamond substrate utilized superficially mirror-polished. The (110) orientation of the diamond substrate may be, evaluating by the $\gamma_{(110)}$ described earlier, 15% or more, more preferably 40% or more.

Diamond substrates that utilize a polycrystalline diamond fabricated by a gas-phase synthesis technique are economical. The gas-phase synthesis of diamond may be carried out under (110)-orienting conditions by a method known to date, such as the microwave-plasma method or hot-filament method. Although by varying the diamond-synthesizing conditions, (110)-oriented or (100)-oriented diamond may be obtained, it was found that when diamond thin films from these are utilized, compared to (110)-oriented diamond, the c-axis orientation and the piezoelectric characteristics of the Li(Nb$_x$Ta$_{1-x}$)O$_3$ thin film are inferior. The substrate for when the diamond is gas-phase synthesized may be anything that enables diamond to be synthesized, but Si wafers are generally used. Following synthesis the diamond is superficially mirror-surface processed using a diamond grindstone. Therein, the diamond surface desirably is mirror-surface processed until its superficial smoothness Ry is 0.1 μm or less.

It is desirable that an amorphous layer 1 nm or more, 50 nm or less in thickness be formed onto the diamond surface by the foregoing mirror-surface process. Covering the polycrystalline-diamond surface with an amorphous layer preferentially c-axis orients the Li(Nb$_x$Ta$_{1-x}$)O$_3$ thin film and allows it to have optimal piezoelectric characteristics as a polycrystalline Li(Nb$_x$Ta$_{1-x}$)O$_3$ thin film. On the other hand, if the polycrystalline-diamond surface is not covered with an amorphous layer, though the polycrystalline-diamond surface is (110)-oriented, inasmuch as diamond crystals having other crystal azimuths will be present, the crystal azimuth in which the Li(Nb$_x$Ta$_{1-x}$)O$_3$ thin film is grown will be subject to the influence of crystal azimuths apart from the (110) of the diamond surface, making it difficult to obtain the favorable c-axis orientation. For the foregoing mirror-surface process, in order that the polycrystalline-diamond surface be covered with an amorphous layer, in the mirror-surface processing using a diamond grindstone, controlling the amount by which the diamond abrasive grains jut out from the diamond grindstone surface is crucial. If the projection amount is large, the diamond abrasive grains will polish tending to scratch the diamond surface of the polycrystalline diamond substrate, which will make it hard to form the amorphous layer. Some 2 μm is a suitable projection amount.

Utilized for the laser ablation, a laser is usable if 360 nm or less in wavelength and 1 μsec or less in pulse duration. While ArF and F$_2$ excimer lasers would be lasers of this sort, it is desirable that laser-pulse energy density be 1 J/cm$^2$ or more, and a 248 nm-wavelength KrF excimer laser, which is capable of activating oxygen, is most suitable. The preferable laser frequency is some 1 to 50 Hz.

As to the laser ablation conditions, the temperature of the polycrystalline diamond substrate may be 400° C. or more, but if 1000° C. or more, the diamond will degenerate, and therefore 1000° C. or less is preferable. Likewise, an oxidizing gas consisting of oxygen, ozone, N$_2$O, NO$_2$, etc. is desirable for the ambient, while a 0.1 to 100 Pa range is preferable for the atmospheric pressure. If the atmospheric pressure is less than 0.1 Pa in pressure, a piezoelectric thin film cannot be formed because the amount of oxygen in the piezoelectric thin film is insufficient. Likewise, if the pressure surpasses 100 Pa, the oxygen becomes excessive, whereupon the energy of the vaporized Li(Nb$_x$Ta$_{1-x}$)O$_3$ material drops due to collision with the ambient gas, which therefore worsens the orientation of the $Li(Nb_xTa_{1-x})O_3$ thin film. The distance between the polycrystalline diamond substrate and the target is suitably 10 nm or more, 1000 mm or less.

It was found that by the laser ablation method as above in order to form onto a diamond substrate a $Li(Nb_xTa_{1-x})O_3$ thin film whose orientation and constituent proportions are favorable, during laser ablation the combination of the temperature of the polycrystalline diamond substrate, and the atomic: constituent proportion $Li/Nb_xTa_{1-x}$ in the piezoelectric thin-film raw-material target, is crucial.

Figure 6:
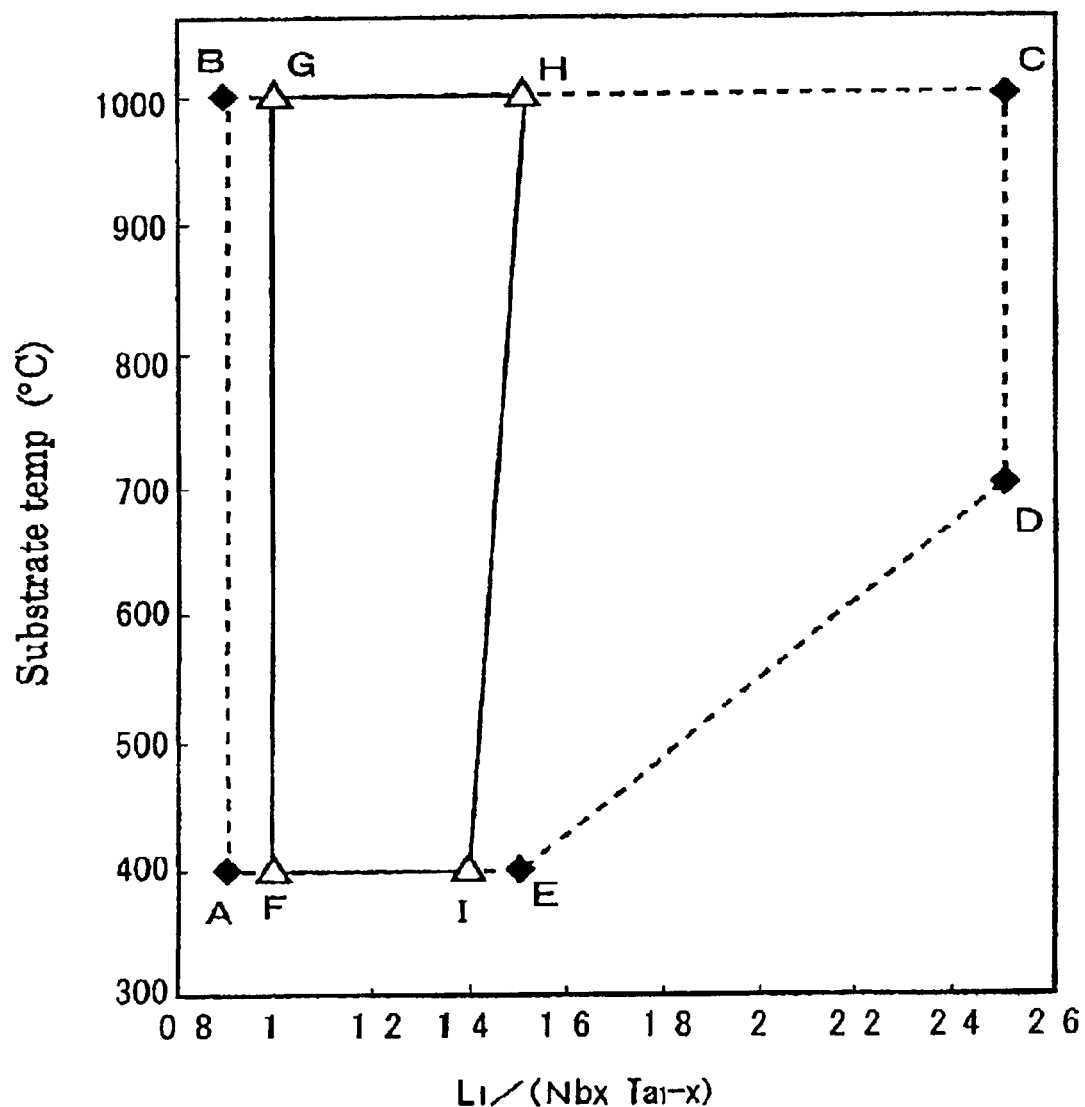
FIG. 6 graphs a range of diamond-substrate temperatures and Li/Nb$_x$Ta$_{1-x}$ proportions in combination, as set out by the present invention.

In particular, in order to achieve the above-noted object of the present invention, the combination of the diamond substrate temperature and the target $Li/Nb_xTa_{1-x}$ atomic constituent proportion is set within the range encompassed by points A, B, C, D and E in FIG. 6. Moreover, to obtain a $Li(Nb_xTa_{1-x})O_3$ thin film of good crystallinity and orientation, the range encompassed by points F, G, H and I in FIG. 6 is satisfactory. When less than 400° C. the $Li(Nb_xTa_{1-x})O_3$ thin film becomes amorphous more readily without crystallizing 400° C. or more, 1000° C. or less is accordingly preferable.

Likewise, if the raw-material $Li/Nb_xTa_{1-x}$ proportion is less than 0.9, crystallization not only of $Li(Nb_xTa_{1-x})O_3$, but also of $LiNb_3O_8$ and like Li-deficient phases proceeds, and the $Li(Nb_xTa_{1-x})O_3$ thin film becomes amorphous more readily. With larger $Li/Nb_xTa_{1-x}$ proportions, i.e., with more Li, an amorphous layer is formed, but $Li_3NbO_4$ and like Li-excess phases are produced. The raw-material target $Li/Nb_xTa_{1-x}$ proportion therefore is desirably 0.9 or more, 1.5 or less. If the $Li/Nb_xTa_{1-x}$ proportion surpasses 1.5, when the polycrystalline-diamond substrate temperature rises, the Li atoms vaporize more readily, and the amount of Li in the thin film that is formed onto the polycrystalline diamond substrate can be controlled to be within a 0.8 to 1.1 range. Nevertheless, 2.5 turns out to be the upper limit for the $Li/Nb_xTa_{1-x}$ proportion, given equilibrium with the polycrystalline-diamond substrate temperatures noted earlier. It is accordingly desirable that the polycrystalline-diamond substrate temperature and the $Li/Nb_xTa_{1-x}$ proportion be within the range as indicated in FIG. 6.

A $Li(Nb_xTa_{1-x})O_3$ sintered body may be utilized for the raw-material target. A sintered body in which to be the raw material $Li_2CO_3$ and $Li_2O$ are admixed to adjust the composition may be utilized. The $Li/Nb_xTa_{1-x}$ constituent proportion in the admixture preferably is within a range of 0.9 or more, 2.5 or less.

The electrode for carrying out laser ablation while applying a bias voltage may be anything that is electroconductive, but in terms of handling, metal is preferable. Likewise, in order that polarization be carried out uniformly, the area of the electrode should be at least be the same as the area of the polycrystalline diamond substrate, or may be larger than that in area. Although there is no particular upper limit, depending on the size of the device used, an upper limit will naturally be determined.

Film-deposition of a $Li(Nb_xTa_{1-x})O_3$ thin film utilizing a diamond substrate, raw-material target, laser, and electrode as in the foregoing while setting up an electric field in the diamond-substrate and electrode interval makes it possible to form a $Li(Nb_xTa_{1-x})O_3$ thin film superior in piezoelectric characteristics. Inasmuch as forming a $Li(Nb_xTa_{1-x})O_3$ thin film by a method as above allows a polarization process to be conducted on the $Li(Nb_xTa_{1-x})O_3$ thin film with an electric field smaller than the coercive electric field of single-crystal $Li(Nb_xTa_{1-x})O_3$ the piezoelectric characteristics will be superior.

This is because the $Li(Nb_xTa_{1-x})O_3$ thin-film surface is in a quasi-steady state during film deposition and inasmuch as the Li atoms, whose degree of movement is high in crystallizing, travel following the electric field, a sufficiently polarizing process may be performed with an electric field smaller than that of the post-crystallization steady state.

The electric field is generated by installing a direct-current power source in between the polycrystalline diamond substrate and the electrode, and applying an electric potential to the electrode. To be polarization-enabling the electric field the diamond-substrate and electrode interval should be 10 to 1000 V/cm. Polarization will not be effected at less than 10 V/cm. Likewise, in excess of 1000 V/cm, because the electrode discharges, impurities are more liable to become mixed into the forming $Li(Nb_xTa_{1-x})O_3$ thin film, which ties in at the same time with deterioration in film quality. Nevertheless, inasmuch as electric discharge is liable to occur under a reduced-pressure atmosphere, in order to suppress discharging and make the polarization process more efficient, the electric field more preferably is 100 to 300 V/cm.

A $Li(Nb_xTa_{1-x})O_3$ thin film formed onto a diamond substrate in the foregoing way will be c-axis-oriented. Orientation assessment was made by evaluating according to the X-ray rocking-pattern technique. Details of this evaluation method are disclosed for example in Japanese Pub. Pat. App. No. H08-32398. This method indicates that the smaller the standard deviation σ of the measured rocking curve, the better the $Li(Nb_xTa_{1-x})O_3$ orientation. The σ value for $Li(Nb_xTa_{1-x})O_3$ thin films in the presents invention was 2° or less.

In addition, utilizing a diamond substrate on which a $Li(Nb_xTa_{1-x})O_3$ thin film obtained through the present invention was formed, a SAW filter was prepared and its characteristics were evaluated, wherein a surface-acoustic wave having a velocity of 10,000 m/s or more was present, and that the piezoelectric characteristics of the obtained $Li(Nb_xTa_{1-x})O_3$ thin film were particularly outstanding was clearly evident.

Embodiment 1

FIG. 1 shows an outline of the device. The laser beam from an excimer laser 1 is irradiated via a lens 2 and a window 3 onto a raw-material target 4, instantaneously vaporizing the raw-material target to form a piezoelectric thin film onto a diamond substrate 5. A sintered body (size: 20 mmφ×5 mm) for $LiNbO_3$ to be the raw material was utilized as the raw-material target. The Li/Nb constituent proportion in the target was made 1.0.

As to a polycrystalline diamond substrate, under (110)-orienting conditions approximately 25 μm polycrystalline diamond was formed onto single-crystal Si by a hot-filament gas-phase synthesis technique, after which the diamond surface was mirror-surface processed utilizing a diamond grindstone in which the diamond abrasive grains' projection amount was controlled to be some 2 μm. The superficial smoothness Ry of the diamond after being mirror-surfaced was 0.08 μm.

On observing the epi-surface of this diamond substrate (A) by the transmission electron diffraction method, diffraction images were not apparent, confirming that an amorphous layer had been formed. In the same way, furthermore, a polycrystalline diamond substrate (B) in which the synthesized diamond was mirror-surface processed utilizing a diamond grindstone in which the diamond abrasive grains' projection amount was controlled to be 5 μm or more was readied. On observing the surface of this diamond substrate (B) likewise by the transmission electron diffraction method, diffraction images were apparent, confirming that an amorphous layer had not been formed. The superficial smoothness Ry of the diamond substrate (B), furthermore, was 0.08 μm.

Under an oxygen gas atmosphere $LiNbO_3$ thin films were deposited onto the two types of substrates described above by irradiating the laser beam from a 248 nm-wavelength KrF excimer laser onto the sintered body. The output of the laser utilized was 750 mJ, the laser-pulse energy density was $J/cm^2$, and the frequency was 5 Hz. The diamond substrate temperature was put at 500° C.; the distance between the target and the diamond substrate, 80 mm; the reaction pressure, 13 Pa; and the reaction time, 30 min.

Figure 2:
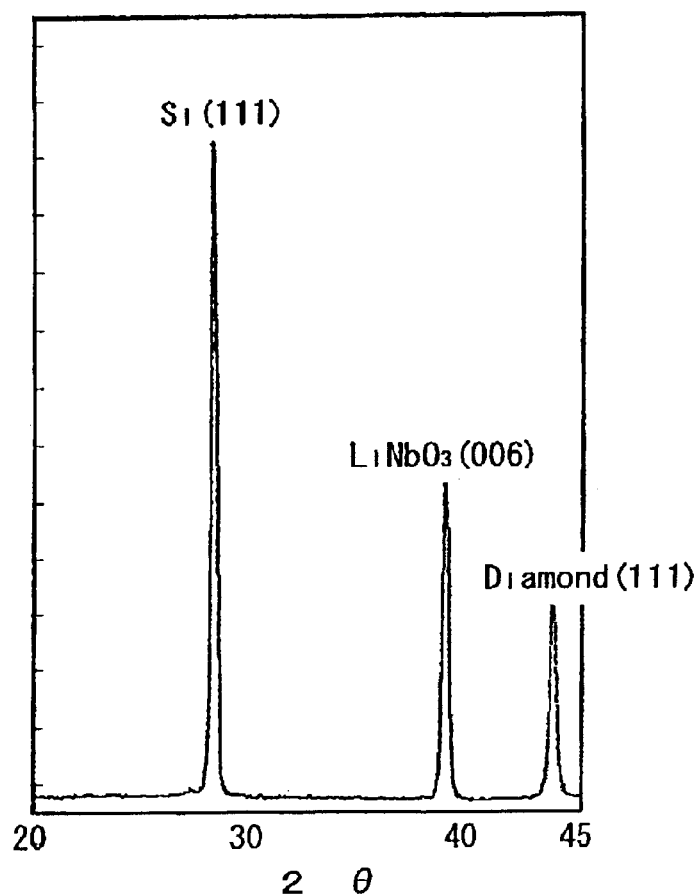
FIG. 2 shows an X-ray diffraction pattern for a Li(Nb$_x$Ta$_{1-x}$)O$_3$ thin film formed in Embodiment 1.
Figure 3:
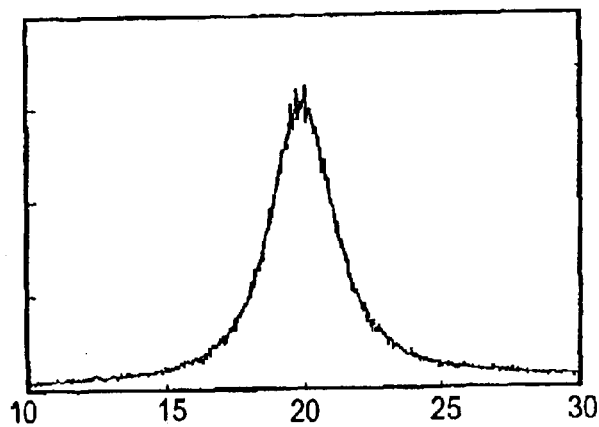
FIG. 3 shows a rocking curve for a Li(Nb$_x$Ta$_{1-x}$)O$_3$ thin film formed in Embodiment 1.
Figure 4:
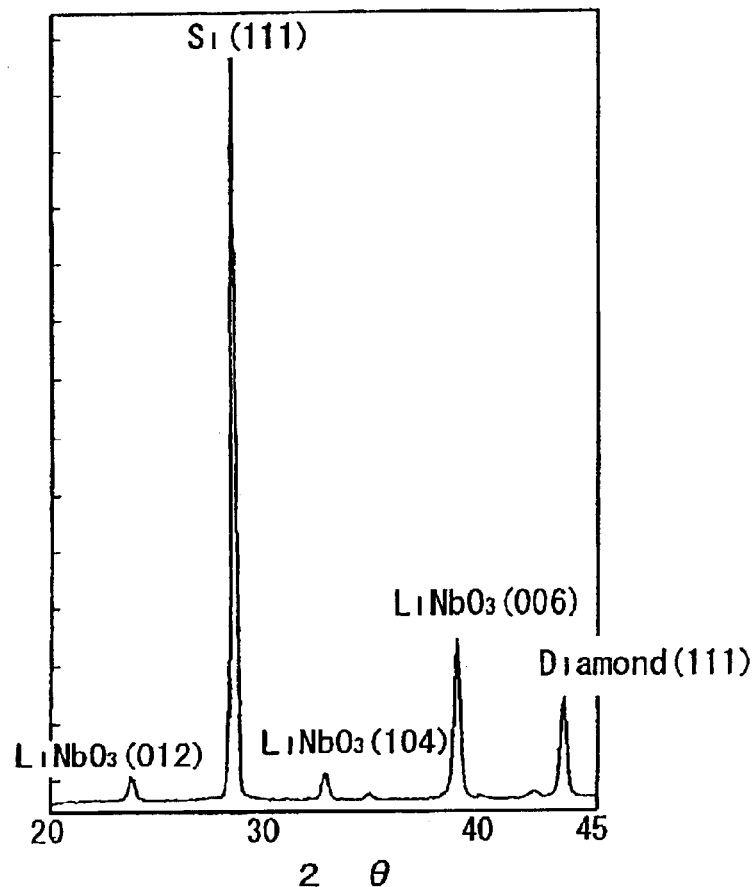
FIG. 4 shows an X-ray diffraction pattern for a Li(Nb$_x$Ta$_{1-x}$)O$_3$ thin film formed in Embodiment 1.
Figure 5:
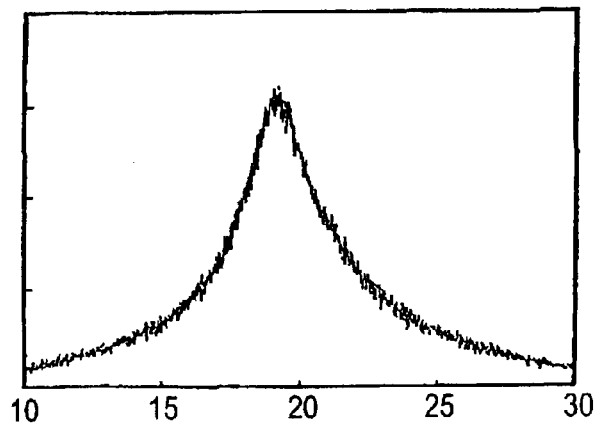
FIG. 5 shows a rocking curve for a Li(Nb$_x$Ta$_{1-x}$)O$_3$ thin film formed in Embodiment 1.

X-ray diffraction patterns and rocking curves for the obtained $LiNbO_3$ thin films are shown in FIGS. 2 through 5. FIGS. 2 and 3 are for wherein diamond substrate (A) was utilized; FIGS. 4 and 5 are for wherein diamond substrate (B) was utilized. According to FIGS. 2 and 3, the obtained $LiNbO_3$ thin film was c-axis oriented, and the $\gamma_c$, being 100%, was exceedingly favorable. Furthermore, with the σ value being 1.13°, it is evident that the orientation was satisfactory. According to FIGS. 4 and 5, in the case in which diamond substrate (B) not having an amorphous layer was utilized, the $LiNb_3$ thin film was c-axis oriented although (012) and (104) surfaces were apparent; the $\gamma_c$ therein was 69%. Likewise, with the σ value being 1.74°, the orientation was better than that of $LiNbO_3$ thin films obtained by conventional methods, but was inferior to that for the instance in which a diamond substrate on which an amorphous layer was formed was utilized. Here, the Li/Nb proportion in the formed $LiNbO_3$ thin film was 0.90 for diamond substrate (A), and was 0.89 for diamond substrate (B).

Embodiment 2

The same device as in Embodiment 1 was utilized. A sintered body (size: 20 mmϕ×5 mm) for an admixture of $LiNbO_3$ and $Li_2CO_3$ to be the raw material was utilized as the raw-material target. The Li/Nb constituent proportion in the target was made 1.0.

As to polycrystalline diamond substrates, varying the orienting conditions, polycrystalline diamond to 25 μm thickness was formed onto single-crystal Si by a hot-filament gas-phase synthesis technique, after which the diamond surfaces were mirror-surface processed. The $\gamma_{(110)}$ values indicating superficial smoothness and orientation of the diamond after being mirror-surfaced are shown in Table I. Here, the epi-surface of the diamond substrates was observed by the transmission electron diffraction method likewise as with Embodiment 1, confirming that amorphous layers had been formed.

Utilizing raw-material target and polycrystalline diamond substrates as in the above, and utilizing the same laser as in Embodiment 1, under an oxygen gas atmosphere a $LiNbO_3$ thin film was deposited onto the polycrystalline diamond substrates. The laser ablation conditions were made the same conditions as in Embodiment 1. σ values measured by the X-ray diffraction pattern technique, and thin-film Li/Nb proportions, for the formed $LiNbO_3$ thin films are shown in Table I.

TABLE I

| | Diamond surface smoothness (μm) | $\gamma_{(110)}$ (%) | σ value (°) | Film constituent proportion |
|---|---|---|---|---|
| 1 | 0.07 | 61 | 1.22 | 0.87 |
| 2 | 0.10 | 22 | 1.74 | 0.91 |
| 3* | 0.10 | 5 | 2.15 | 0.86 |

*Mark: comparative example.

As is evident from Table I, the larger the value of $\gamma_{(110)}$ indicating the (110) orientation of the diamond substrate, the smaller the σ value for the formed $LiNbO_3$ thin film becomes, meaning that its c-axis orientation is excellent.

Embodiment 3

The same device as in Embodiment 1 was utilized. A sintered body (size: 20 mmϕ×5 mm) for an admixture of $LiNbO_3$ and $Li_2CO_3$ to be the raw material was utilized as the raw-material target. The Li/Nb constituent proportion in the target was adjusted so as to make the compositions indicated in Table II.

As to polycrystalline diamond substrates, polycrystalline diamond was formed under the orienting conditions shown in Table II, and to the thicknesses shown in Table II, onto single-crystal Si by a hot-filament gas-phase synthesis technique, after which the diamond surfaces were mirror-surface processed. The superficial smoothnesses of the diamond after being mirror-surfaced are shown in Table II. Here, the epi-surface of the diamond substrates was observed by the transmission electron diffraction method likewise as with Embodiment 1, confirming that amorphous layers had been formed. Utilizing a raw-material target and polycrystalline diamond substrates as in the above, and utilizing the same laser as in Embodiment 1, under an oxygen gas atmosphere a $LiNbO_3$ thin film was deposited onto the polycrystalline diamond substrates. The laser ablation conditions, as well as σ values measured by the X-ray diffraction pattern technique, and film Li/Nb proportions, for the formed $LiNbO_3$ thin films are shown in Table II.

TABLE II

| | Diamond thickness (μm) | Diamond surface smoothness (μm) | $\gamma_{(110)}$ (%) | Target constituent proportion | Substrate temperature (° C.) | Target-to-substrate distance (mm) | Reaction pressure (Pa) | Reaction time (min) | σ value (°) | Film constituent proportion |
|---|---|---|---|---|---|---|---|---|---|---|
| 4 | 20 | 0.07 | 61 | 1.4 | 600 | 80 | 26 | 30 | 1.05 | 1.07 |
| 5 | 25 | 0.09 | 80 | 1.0 | 500 | 40 | 26 | 30 | 1.21 | 0.92 |
| 6* | 25 | 0.08 | 74 | 1.0 | 350 | 80 | 13 | 30 | — | 0.91 |
| 7* | 25 | 0.08 | 59 | 1.0 | 500 | 80 | 110 | 30 | — | 0.78 |
| 8* | 25 | 0.08 | 5 | 1.0 | 500 | 80 | 13 | 30 | 2.1 | 0.90 |

*Mark: comparative example.

Results of X-ray diffraction measuring on Nos. 4 and 5 made clear that they were c-axis oriented. With regard to No. 6, micro-particles were numerously apparent on the surface of the obtained thin film, and results of X-ray diffraction measuring made clear that it was in an uncrystallized amorphous form. Although in outward appearance thin film No. 7 quite resembled thin film No. 4, with measuring by X-ray diffraction resulting in strong peaks at (012) and (104) orientations, it was not c-axis oriented. Although thin film No. 8 was c-axis oriented, with the σ value being 2.1° the $LiNbO_3$ orientation was not better than thin film No. 4 utilizing a (110)-oriented polycrystalline diamond substrate.

Embodiment 4

The same device as in Embodiment 1 was utilized. A sintered body (size: 20 mmφ×5 mm) for $LiTaO_3$ to be the raw material was utilized as the raw-material target. Here, as to the Li/Ta constituent proportion in the No. 10 target, $LiTaO_3$ and $Li_2CO_3$ were admixed and adjusted so as to make the composition indicated in Table III.

As to polycrystalline diamond substrates, polycrystalline diamond was formed under the orienting conditions shown in Table III, and to the thicknesses shown in Table III, onto single-crystal Si by a hot-filament gas-phase synthesis technique, after which the diamond surfaces were mirror-surface processed. The superficial smoothnesses of the diamond after being mirror-surfaced are shown in Table III. Here, the epi-surface of the diamond substrates was observed by the transmission electron diffraction method likewise as with Embodiment 1, confirming that amorphous layers had been formed. Utilizing a raw-material target and polycrystalline diamond substrates as in the above, and utilizing the same laser as in Embodiment 1, under an oxygen gas atmosphere a $LiTaO_3$ thin film was deposited onto the polycrystalline diamond substrates. The laser ablation conditions, and σ values measured by the X-ray diffraction pattern technique for the formed $LiTaO_3$ thin films, are shown in Table III.

An X-ray diffraction measurement was carried out on the $LiTaO_3$ thin film obtained in No. 9, wherein other than the peak that is natural to diamond, a peak at 39.28° appeared. This corresponds to a Miller index (006) for $LiTaO_3$, which made it clear that the formed $LiTaO_3$ thin film was c-axis oriented. Its σ value being 1.13° demonstrates that the c-axis orientation was satisfactory. Although No. 10, No. 11, and also No. 12 clearly turned out to be c-axis oriented, with the σ value for No. 12 being 2.1° owing to it utilizing a (100)-oriented polycrystalline diamond substrate, it turned out not to be better than No. 9, which utilized a (110)-oriented polycrystalline diamond substrate. Micro-particles were numerously apparent on the surface of the No. 13 thin film, and measuring by X-ray diffraction made clear that it was in an amorphous form. Although in outward appearance thin film No. 14 quite resembled No. 9, in the results from X-ray diffraction measurement, other than the peak that is natural to diamond, peaks at 23.76°, 32.88° and 39.30° were apparent. These correspond to Miller indices (012), (104) and (006) for the $LiTaO_3$ thin film, which demonstrated that it was not c-axis oriented.

Embodiment 5

The same device as in Embodiment 1 was utilized. A sintered body (size: 20 mmφ×5 mm) in which raw material 1 and raw material 2 set forth in Table IV were admixed, adjusting so as to make the target constituent proportion indicated in Table IV, to be the raw material was utilized as the raw-material target. As to polycrystalline diamond substrates, under (110)-orienting conditions approximately 25 μm polycrystalline diamond was formed onto single-crystal Si by a hot-filament gas-phase synthesis technique, after which the diamond surface was mirror-surface processed. The superficial smoothness of the diamond after being mirror-surfaced was Ry 0.08 μm. Here, the epi-surface of the diamond substrates was observed by the transmission electron diffraction method likewise as with Embodiment 1, confirming that amorphous layers-had been formed.

Utilizing raw-material targets and polycrystalline diamond substrates as in the above, and utilizing the same laser as in Embodiment 1, under an oxygen gas atmosphere a $LiNbO_3$ thin film was deposited onto the polycrystalline diamond substrates. The laser ablation conditions, apart from the substrate temperatures and reaction times, are the same as Embodiment 1. Diamond-substrate temperature conditions, and thin-film compositions obtained by emission spectral analysis of the formed $LiNbO_3$ thin-films are shown in Table IV. Here, the reaction time was 10 min.

TABLE III

| | Diamond thickness (μm) | Diamond surface smoothness (μm) | γ(110) (%) | Target constituent proportion | Substrate temperature (°C.) | Target-to-substrate distance (mm) | Reaction pressure (Pa) | Reaction time (min) | σ value (°) | Film constituent proportion |
|---|---|---|---|---|---|---|---|---|---|---|
| 9 | 25 | 0.08 | 55 | 1.0 | 500 | 80 | 13 | 30 | 1.13 | 0.84 |
| 10 | 20 | 0.07 | 63 | 1.4 | 600 | 80 | 26 | 30 | 1.05 | 1.09 |
| 11 | 25 | 0.09 | 79 | 1.0 | 500 | 40 | 26 | 30 | 1.21 | 0.88 |
| 12* | 25 | 0.10 | 7 | 1.0 | 500 | 80 | 13 | 30 | 2.1 | 0.84 |
| 13* | 25 | 0.08 | 58 | 1.0 | 350 | 80 | 26 | 30 | — | 0.91 |
| 14* | 25 | 0.08 | 62 | 1.0 | 500 | 80 | 110 | 30 | — | 0.79 |

*Mark: comparative example.

TABLE IV

| No. | Raw material 1 | Raw material 2 | Target constituent proportion | Substrate temperature (°C.) | σ value (°) | Li/Nb proportion |
|---|---|---|---|---|---|---|
| 15 | $LiNbO_3$ | $Li_2CO_3$ | 1.1 | 500 | 1.32 | 1.01 |
| 16 | $LiNbO_3$ | $Li_2O$ | 1.2 | 550 | 1.44 | 1.02 |
| 17 | $LiNbO_3$ | $Li_2CO_3$ | 1.6 | 650 | — | 1.09 |
| 18* | $LiNbO_3$ | $Li_2CO_3$ | 2.5 | 500 | — | 1.66 |

*Mark: comparative example.

Figure 7:
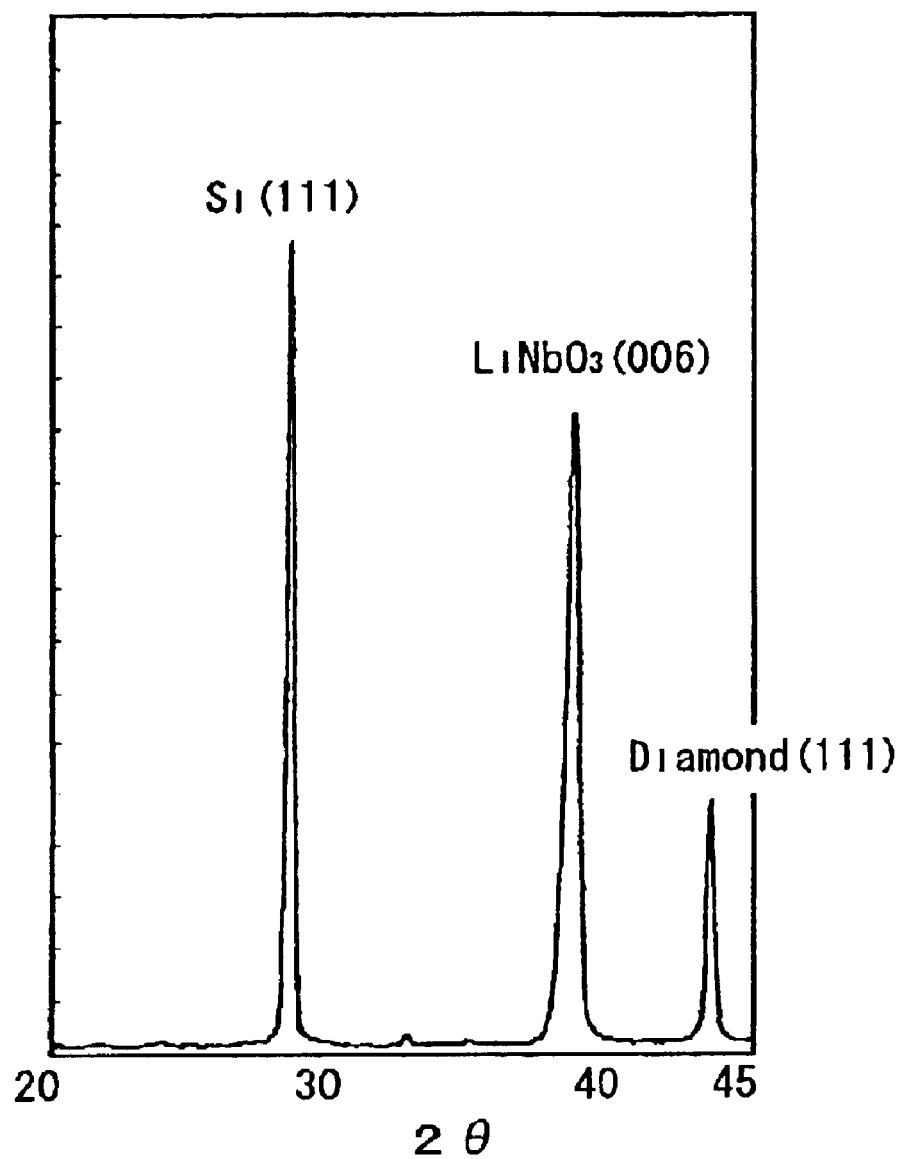
FIG. 7 shows an X-ray diffraction pattern for a Li(Nb$_x$Ta$_{1-x}$)O$_3$ thin film formed in Embodiment 5.
Figure 8:
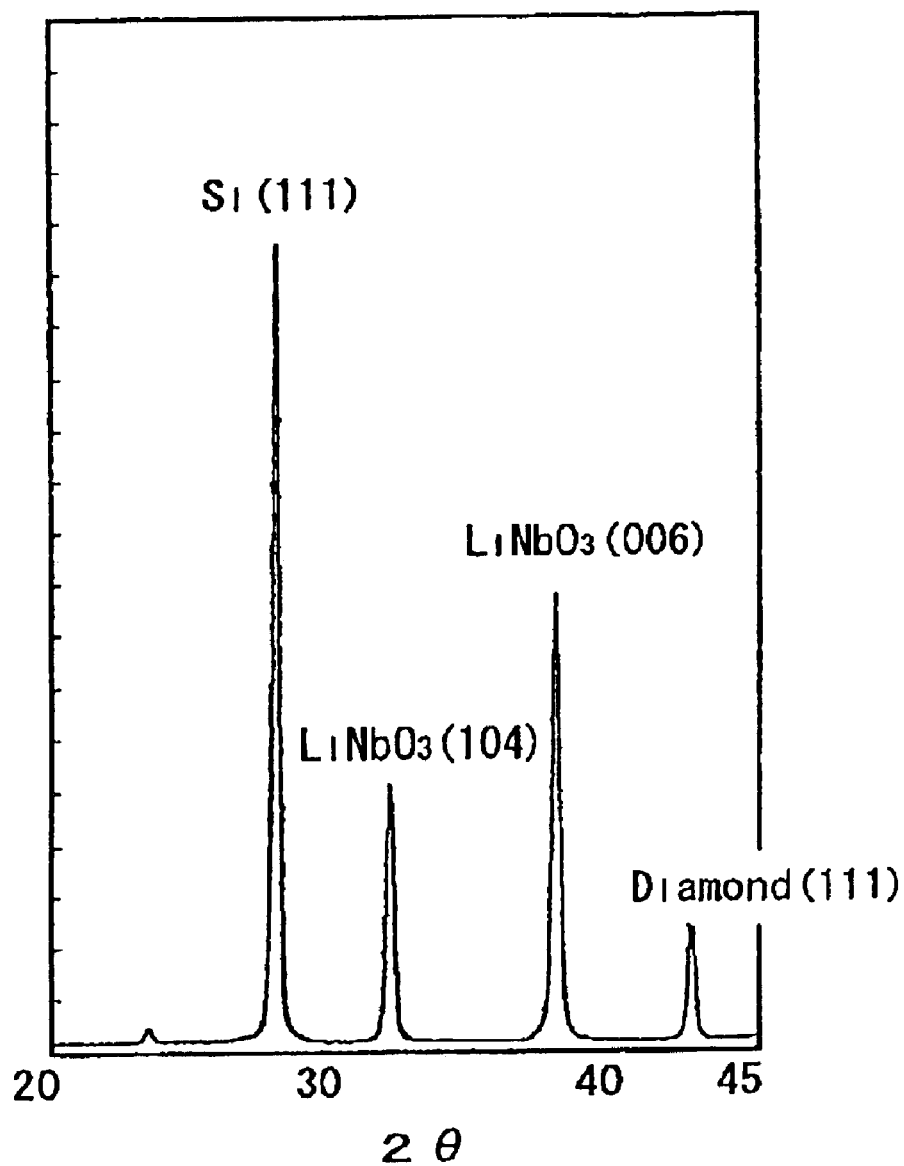
FIG. 8 shows an X-ray diffraction pattern for a Li(Nb$_x$Ta$_{1-x}$)O$_3$ thin film formed in Embodiment 5.

An X-ray diffraction pattern for the thin film obtained in No. 15 is illustrated in FIG. 7. From the figure it is evidentthat the obtained $LiNbO_3$ thin film is single-phase $LiNbO_3$ and c-axis oriented. On examining the obtained thin-film composition under emission spectral analysis, the Li/Nb proportion was 1.01, which means it was near the stoichiometric composition. An X-ray diffraction analysis was done on the No. 16 thin film, wherein it was single-phase $LiNbO_3$. Furthermore, on examining the composition of the obtained thin film under emission spectral analysis, the Li/Nb proportion was 1.02. An X-ray diffraction pattern for the thin film obtained in No. 17 is illustrated in FIG. 8. From the figure it is evident that the obtained $LiNbO_3$ thin film is single-phase $LiNbO_3$, but that with a (104) peak apparent, its c-axis orientation is not satisfactory. Furthermore, on examining composition of the obtained thin film under emission spectral analysis, the Li/Nb proportion was 1.09. Results of measuring by X-ray diffraction the thin film obtained in No. 18 were that it was in an uncrystallized amorphous form. Likewise, from the results of carrying out an emission spectral analysis it was evident that the Li/Nb proportion, being1.66, deviated significantly from the stoichiometric composition. It was understood that making the polycrystalline diamond substrate and the Li/Nb proportion for the target be within the range shown in FIG. 6 enables rendering a thin film whose orientation is superior—a formed $LiNbO_3$ thin film whose Li/Nb proportion will be 0.08 or more, 1.10 or less.

Embodiment 6

Figure 9:
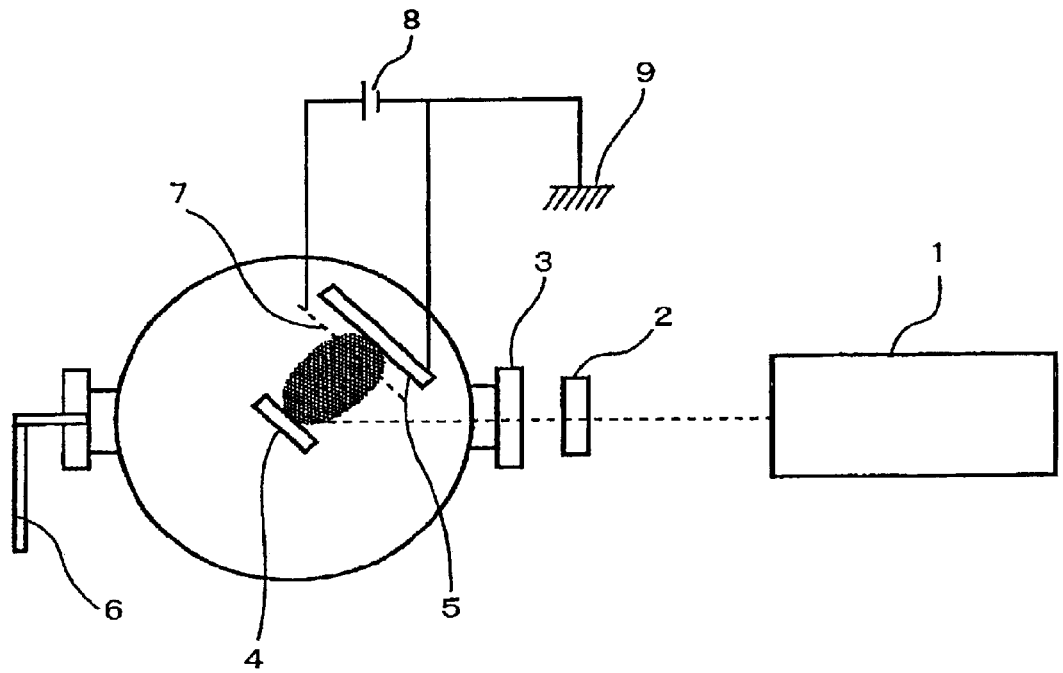
FIG. 9 illustrates an outline of a separate embodiment of a laser ablation device of the present invention.

An outline of an embodiment of the present invention that involves applying a bias voltage is illustrated in FIG. 9. An electrode 7 was arranged in between the raw-material target 4 and the diamond substrate 5, in parallel With the diamond substrate. A sintered body (size: 20 mmφ×5 mm) for $LiNbO_3$ powder to be the raw material was utilized as the raw-material target. The Li/Nb constituent proportion in the target was 1.0. The electrode utilized was one in which tungsten wires 0.15 mm in diameter were strung vertically at 2 mm spacings and fixed to a stainless-steel frame. As to the diamond substrate, under (110)-orienting conditions approximately 25 μm polycrystalline diamond was formed onto single-crystal Si by a hot-filament gas-phase synthesis technique, after which the diamond surface was mirror-surface processed. The superficial smoothness of the diamond after being mirror-surface was Ry 0.08 μm. Here, the epi-surface of the diamond substrate was observed by the transmission electron diffraction method likewise as with Embodiment 1, confirming that amorphous layers had been formed. The diamond substrate and the electrode were disposed in parallel with the raw-material target. Under an oxygen gas atmosphere, a $LiNbO_3$ thin film was deposited onto the substrate by irradiating the laser beam, from the 248 nm-wavelength KrF excimer laser 1 via the lens 2 and the window 3 onto the sintered-body target.

The electrode potential was put at 140 V by a direct-current power source 8, and the diamond-substrate potential put to 0 V (ground 9). The distance between the electrode and the substrate was 6 mm, and the electric field in the electrode and substrate interval was 233 V/cm. The substrate temperature was put at 530° C., and the reaction time set to 6 min. Apart from that, conditions were likewise as with Embodiment 1.

Figure 11:
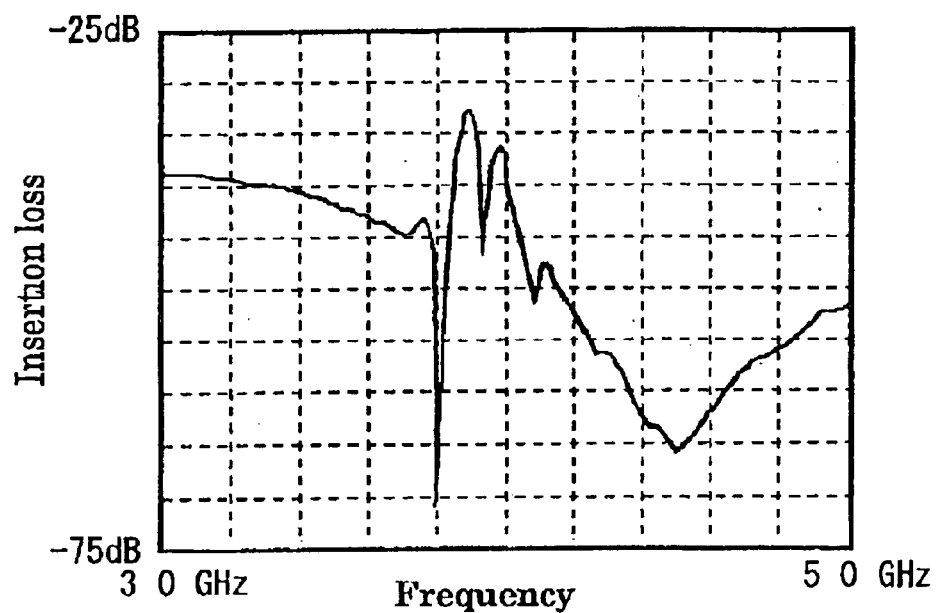
FIG. 11 diagrams characteristics of an SAW filter obtained in Embodiment 6.
Figure 12:
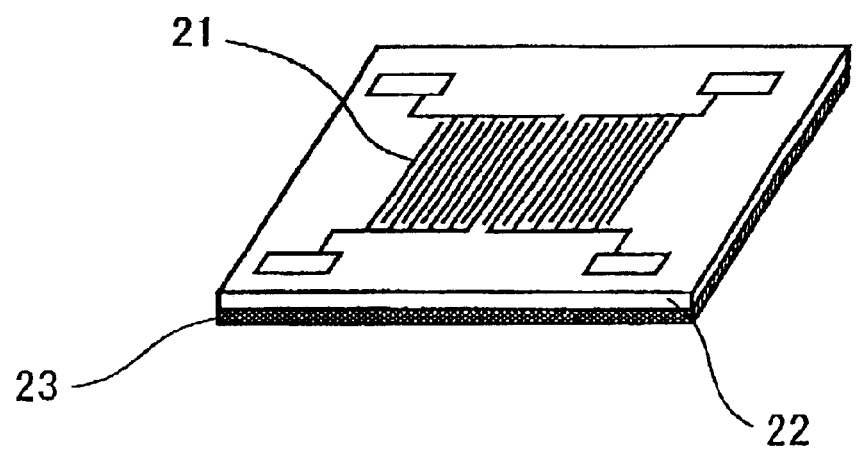
FIG. 12 illustrates an interdigitated electrode used for evaluation in the present invention.

Synthesis of a $LiNbO_3$ thin film onto the diamond substrate was carried out under the foregoing conditions. the σ value for the obtained $LiNbO_3$ thin film was 1.27°, and the Li/Nb proportion was 0.84°. A 3.2 μm-pitch interdigital transducer (abbreviated "IDT" hereinafter) as depicted in FIG. 12 was built by a photolithographic process onto the formed $LiNbO_3$ thin film. The utilizing the IDT its SAW filter characteristics were evaluated, wherein it was evident that frequency characteristics as in FIG. 11 were obtained, and that surface-acoustic waves having a speed of 12,400 m/s were present. These facts indicate that the piezoelectric characteristics of the obtained $LiNbO_3$ thin film are excellent.

For comparison, a $LiNbO_3$ thin film was formed under the same conditions as with Embodiment 5, without setting up an electric field in the electrode and substrate interval. An IDT was built on the formed $LiNbO_3$ thin film in the same manner as in Embodiment 5, and its SAW filter characteristics were evaluated, wherein it was evident that SAW filter characteristics were not obtained, meaning that a piezoelectrically poor $LiNbO_3$ thin film had been formed.

Embodiment 7

The same device, raw-material target, electrode, and diamond substrate as with Embodiment 6 were utilized. Except for the electric potential between the electrode and the substrate, the film-deposition conditions were made the same as with Embodiment 1. An electric field of 233 V/cm was set up in the electrode and substrate interval by making the electrode electric potential 0 V (ground) and the electric potential on the diamond substrate −140 V. An IDT was built, in the same manner as in Embodiment 6, on the $LiNbO_3$ thin film formed in this way, and its SAW filter characteristics were evaluated, wherein it was evident that results likewise as with Embodiment 6 were obtained, meaning that a $LiNbO_3$ thin film of excellent piezoelectric characteristics had been formed.

Embodiment 8

The same device, electrode, diamond substrate, and film-deposition conditions as with Embodiment 6 were utilized. A sintered body in which $Li(Nb_{0.5}Ta_{0.5})O_3$ powder was sintered was utilized for the raw-material target. An IDT was built, in the same manner as in Embodiment 6, on the $Li(Nb_{0.5}Ta_{0.5})O_3$ thin film formed in this way, and its SAW filter characteristics were evaluated, wherein it was evident that results likewise as with Embodiment 6 were obtained, meaning that a $Li(Nb_{0.5}Ta_{0.5})O_3$ thin film of excellent piezoelectric characteristics had been formed.

Embodiment 9

Figure 10:
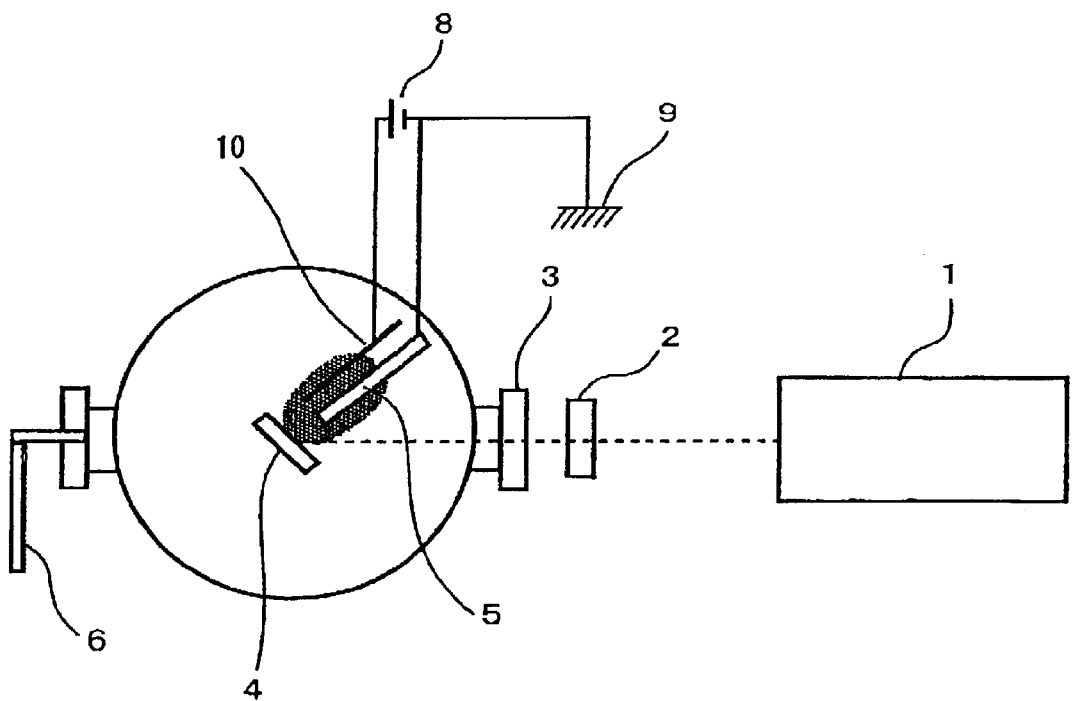
FIG. 10 illustrates an outline of a separate embodiment of a laser ablation device of the present invention.

The device illustrated in FIG. 10 was utilized. The diamond substrate 5 and an electrode 10 were arranged so as to be normal to a raw material target 13. With the layout being thus, inasmuch as particles that laser ablation ejects from the target will not pass through the electrode, in-mixing into the formed thin film of impurities such as electrode components may be lessened. A sintered body (size: 20 mmφ×5 mm) for $LiNbO_3$ powder to be the raw material was utilized as the raw-material target. The Li/Nb constituent proportion in the target was 1.0. A stainless-steel sheet 1 mm thick was utilized for the electrode. As to the diamond substrate, under (110)-orienting conditions approximately 25 μm polycrystalline diamond was formed onto single-crystal Si by a hot-filament gas-phase synthesis technique, after which the diamond surface was mirror-surface processed. The superficial smoothness of the diamond after being mirror-surfaced was Ry 0.08 μm. Here, the epi-surface of the diamond substrate was observed by the transmission electron diffraction method likewise as with Embodiment 1, confirming that amorphous layers had been formed. Under an oxygen gas atmosphere, a $LiNbO_3$ thin film was deposited onto the diamond substrate by irradiating the laser beam from the 248 nm-wavelength KrF excimer laser 1 via the lens 2 and the window 3 onto the sintered-body target.

The electrode potential was put at 140 V by a direct-current power source 8, and the diamond-substrate potential put to 0 V (ground 9). The distance between the electrode and the substrate was 6 mm, and the electric field in the electrode and substrate interval was 233 V/cm. The substrate temperature was put at 530° C., and the reaction time set to 8 min. Apart from that, conditions were likewise as with Embodiment 1. It should be understood that the distance between the target and the diamond substrate in this case is given by the distance between the target surface and the center of the diamond substrate.

An IDT was built, in the same manner as in Embodiment 6, on the $LiNbO_3$ thin film formed in this way, and its SAW filter characteristics were evaluated, wherein it was evident that results likewise as with Embodiment 6 were obtained, meaning that a $LiNbO_3$ thin film of excellent piezoelectric characteristics had been formed.

INDUSTRIAL APPLICABILITY

In terms of the present invention as in the foregoing, specifying as (110) the orientation of a gas-phase synthesized polycrystalline diamond per se and mirror-surface processing the diamond surface, enables a favorably c-axis oriented $Li(Nb_xTa_{1-x})O_3$ thin film to be formed onto the diamond utilizing a laser ablation technique. The formed $Li(Nb_xTa_{1-x})O_3$ thin films exhibit favorable c-axis orientation not present to date. Likewise, if the gas-phase synthesized polycrystalline diamond is superficially covered with an amorphous layer the formed $Li(Nb_xTa_{1-x})O_3$ thin films will manifest still better piezoelectric characteristics. Likewise, forming under an electric field a $Li(Nb_xTa_{1-x})O_3$ thin film onto the diamond substrate enables a $Li(Nb_xTa_{1-x})O_3$ ($0 \leq x \leq 1$) thin film whose piezoelectric characteristics are more outstanding to be obtained. Most favorable are the piezoelectric characteristics of a $Li(Nb_xTa_{1-x})O_3$ thin film formed by a laser ablation technique under an electric field onto a (110)-oriented gas-phase synthesized polycrystalline diamond substrate superficially covered with an amorphous layer. Surface-acoustic wave devices having high propagation speeds may be fabricated utilizing a composite substrate on which this sort of piezoelectrically outstanding $Li(Nb_xTa_{1-x})O_3$ ($0 \leq x \leq 1$) thin film formed onto a diamond substrate is built.

What is claimed is:

1. A diamond substrate on which is formed a $Li(Nb_xTa_{1-x})O_3$ (wherein $0 \leq x \leq 1$) thin film, being a piezoelectric thin film over a (110)-oriented gas-phase synthesized polycrystalline diamond substrate.

2. The diamond substrate set forth in claim 1, characterized in that the X-ray diffraction intensity $I_{(220)}$ of a (220) face of said gas-phase synthesized polycrystalline diamond substrate is 15% or more of the sum of the X-ray diffraction intensities of all form faces of said gas-phase synthesized polycrystalline diamond.

3. The diamond substrate set forth in claim 2, characterized in that the X-ray diffraction intensity $I_{(220)}$ is 40% or more of the sum of the X-ray diffraction intensities of all said form faces.

4. The diamond substrate set forth in claim 1, characterized in that said piezoelectric thin film is c-axis oriented.

5. A method for manufacturing a diamond substrate on which a piezoelectric thin film is formed, including: a step of preparing a (110)-oriented gas-phase synthesized polycrystalline diamond substrate as recited in claim 1; and a step of utilizing a laser ablation technique to form a piezoelectric thin-film $Li(Nb_xTa_{1-x})O_3$ (wherein $0 \leq x \leq 1$) onto said polycrystalline diamond substrate.

6. The diamond-substrate manufacturing method set forth in claim 5, characterized in that in said laser ablation technique, the laser wavelength is 360 nm or less.

7. The diamond-substrate manufacturing method set forth in claim 5, characterized in that in said laser ablation technique, the laser is a KrF excimer laser.

8. The diamond-substrate manufacturing method set forth in claim 5, characterized in that in said laser ablation technique, the piezoelectric thin film is formed under an atmospheric pressure of 0.1 to 100 Pa.

9. The diamond-substrate manufacturing method set forth in claim 5, characterized in that in said laser ablation technique, the piezoelectric thin film is formed with a raw-material target for the piezoelectric thin film and said gas-phase synthesized polycrystalline diamond substrate being at a distance of 10 to 1000 mm.

10. The diamond-substrate manufacturing method set forth in claim 5, characterized in that in said laser ablation technique, the piezoelectric thin film is formed with the temperature of said gas-phase synthesized polycrystalline diamond substrate, and the atomic constituent proportion $Li/Nb_xTa_{1-x}$ of raw-material-target Li and $Nb_xTa_{1-x}$ being in the range encompassed by points A, B, C, D, and E in FIG. 6.

11. The diamond-substrate manufacturing method set forth in claim 10, characterized in that temperature of said gas-phase synthesized polycrystalline diamond substrate, and the atomic constituent proportion $Li/Nb_xTa_{1-x}$ of raw-material-target Li and $Nb_xTa_{1-x}$ are in the range encompassed by points F, G, H, and I in FIG. 6.

12. The diamond-substrate manufacturing method set forth in claim 5, characterized in that in said laser ablation technique, a one electrode is installed in the environs of the polycrystalline diamond substrate, and with the polycrystalline diamond substrate as the other electrode, the piezoelectric thin film is formed while a bias voltage is applied across the one electrode and the polycrystalline diamond substrate.

13. The diamond-substrate manufacturing method set forth in claim 12, characterized in that the one electrode is disposed in parallel with the surface of said polycrystalline diamond substrate on which the piezoelectric thin film is formed.

14. The diamond-substrate manufacturing method set forth in claim 12, characterized in that the one electrode is a metal filament material strung into a mesh or grate form, or else is a metal sheet.

15. The diamond-substrate manufacturing method set forth in claim 13, characterized in that the one electrode and said polycrystalline diamond substrate are arranged so as to be practically parallel to the flight path of particles ejected by the laser ablation.

16. The diamond-substrate manufacturing method set forth in claim 13, characterized in that the one electrode is a metal filament material strung into a mesh or grate form, or else is a metal sheet.

17. The diamond-substrate manufacturing method set forth in claim 15, characterized in that the one electrode is a metal filament material strung into a mesh or grate form, or else is a metal sheet.

* * * * *